(12) United States Patent
Chen et al.

(10) Patent No.: US 8,906,594 B2
(45) Date of Patent: Dec. 9, 2014

(54) NEGATIVE-WORKING THICK FILM PHOTORESIST

(75) Inventors: Chunwei Chen, Bridgewater, NJ (US); PingHung Lu, Bridgewater, NJ (US); Weihong Liu, Bridgewater, NJ (US); Medhat Toukhy, Flemington, NJ (US); SangChul Kim, Ansung-si (KR); SookMee Lai, Kakegawa (JP)

(73) Assignee: AZ Electronic Materials (Luxembourg) S.A.R.L., Luxembourg (LU)

( * ) Notice: Subject to any disclaimer, the term of this patent is extended or adjusted under 35 U.S.C. 154(b) by 0 days.

(21) Appl. No.: 13/524,811

(22) Filed: Jun. 15, 2012

(65) Prior Publication Data

US 2013/0337381 A1 Dec. 19, 2013

(51) Int. Cl.
*G03F 7/028* (2006.01)
*G03F 7/075* (2006.01)
*G03F 7/40* (2006.01)
*G03F 7/30* (2006.01)

(52) U.S. Cl.
CPC .............. *G03F 7/028* (2013.01); *G03F 7/0755* (2013.01); *G03F 7/30* (2013.01); *G03F 7/40* (2013.01); *G03F 7/0757* (2013.01)
USPC ...................... 430/285.1; 430/281.1; 430/325

(58) Field of Classification Search
None
See application file for complete search history.

(56) References Cited

U.S. PATENT DOCUMENTS

| | | | |
|---|---|---|---|
| 3,953,408 A * | 4/1976 | Hosoi et al. .................... | 525/286 |
| 4,200,729 A | 4/1980 | Calbo | |
| 4,251,665 A | 2/1981 | Calbo | |
| 4,806,450 A * | 2/1989 | Hofmann et al. .......... | 430/281.1 |
| 5,187,019 A | 2/1993 | Calbo et al. | |
| 5,968,688 A * | 10/1999 | Masuda et al. .................... | 430/7 |
| 6,210,846 B1 | 4/2001 | Rangarajan et al. | |
| 6,824,947 B2 | 11/2004 | Ishizuka et al. | |
| 6,919,159 B2 | 7/2005 | Matsumoto et al. | |
| 7,255,970 B2 | 8/2007 | Toukhy et al. | |
| 7,601,482 B2 | 10/2009 | Pawlowski et al. | |
| 2001/0044075 A1 | 11/2001 | Nishimura et al. | |
| 2002/0058199 A1 | 5/2002 | Zampini et al. | |
| 2002/0061464 A1 | 5/2002 | Aoai et al. | |
| 2003/0235782 A1 | 12/2003 | Padmanaban et al. | |
| 2004/0005513 A1 | 1/2004 | Takahashi et al. | |
| 2004/0110099 A1 | 6/2004 | Kozawa et al. | |
| 2004/0142280 A1 | 7/2004 | Iwanaga et al. | |
| 2004/0229155 A1 | 11/2004 | Rahman et al. | |
| 2004/0265733 A1 | 12/2004 | Houlihan et al. | |
| 2005/0019691 A1 | 1/2005 | Tseng et al. | |
| 2005/0019705 A1 | 1/2005 | Thackeray et al. | |
| 2005/0136343 A1 * | 6/2005 | Mizukawa et al. ............... | 430/7 |
| 2005/0271974 A1 | 12/2005 | Rahman et al. | |
| 2007/0190465 A1 | 8/2007 | Nishikawa et al. | |
| 2008/0076044 A1 * | 3/2008 | Mizukawa et al. ............... | 430/7 |
| 2008/0090172 A1 | 4/2008 | Hatakeyama et al. | |
| 2009/0176337 A1 | 7/2009 | Kang et al. | |
| 2010/0047715 A1 | 2/2010 | Washio et al. | |
| 2010/0248146 A1 | 9/2010 | Tsuchihashi et al. | |
| 2011/0081612 A1 | 4/2011 | Fujii et al. | |
| 2011/0135749 A1 * | 6/2011 | Sellinger et al. .............. | 424/601 |
| 2012/0003437 A1 * | 1/2012 | Wada et al. ................. | 428/195.1 |
| 2012/0141940 A1 | 6/2012 | Shimizu et al. | |
| 2013/0337380 A1 | 12/2013 | Liu et al. | |

FOREIGN PATENT DOCUMENTS

| | | |
|---|---|---|
| EP | 0 935 171 A1 | 8/1999 |
| GB | 2 415 515 A | 12/2005 |
| JP | 8-78318 A | 3/1996 |
| JP | 2009-63824 A | 3/2009 |
| WO | WO 2005/054951 A2 | 6/2005 |
| WO | WO 2007/110773 A2 | 10/2007 |
| WO | WO-2011/046192 a1 * | 4/2011 |

OTHER PUBLICATIONS

Form PCT/ISA/220, Form PCT/ISA/210, and Form PCT/ISA/237 for PCT/EP2013/059771 dated Jul. 29, 2013, which corresponds to U.S. Appl. No. 13/524,790.
Specification of U.S. Appl. No. 13/524,790, filed Jun. 15, 2012 with cover page.
Advisory Action mail date Apr. 10, 2014 for U.S. Appl. No. 13/524,790.
Final Office Action mail date Jan. 30, 2014 for U.S. Appl. No. 13/524,790.
Office Action mail date Jul. 30, 2013 for U.S. Appl. No. 13/524,790.
Office Action mail date Jul. 17, 2013 for U.S. Appl. No. 13/524,790.
Form PCT/ISA/220, Form PCT/ISA/210, and Form PCT/ISA/237 for PCTEP2013059772 dated Jul. 25, 2013, which corresponds to U.S. Appl. No. 13/524,811.

\* cited by examiner

*Primary Examiner* — Cynthia Hamilton
(74) *Attorney, Agent, or Firm* — Sangya Jain

(57) ABSTRACT

Disclosed are compositions for negative-working thick film photophotoresists based on acrylic co-polymers. Also included are methods of using the compositions.

12 Claims, No Drawings

NEGATIVE-WORKING THICK FILM PHOTORESIST

Disclosed are negative-working photosensitive photoresist compositions for thick film applications as well as methods of making thick film negative relief images. The relief images prepared from these compositions and methods can be used in the formation of metal bumps and posts useful for electronic innerlayer interconnections. They can also be used as templates for electrochemical deposition of metal wiring patterns. These photofabrication methods have found utility in such application as chip scale packaging, microelectronic machine systems, high density interconnections, liquid crystal devices, organic transistors, light emitting diode, displays and the like.

The manufacture of many electronic components can often only easily be achieved with the use of thick film photosensitive photoresist materials, compositions and methods. The process involves coating a desired substrate with a photosensitive photoresist composition and drying followed by exposing the photoresist to actinic radiation through a photomask which contains the desired pattern of line traces, bump holes and other structures. In the case of a negative photoresist the exposed areas are hardened, while the unexposed areas are removed by a suitable developing solution, generally aqueous based. In many photofabrication processes the thickness of the coated and dried photoresist is required to be 30 microns while the line traces, bump holes and other structures have dimension that can be at least 15 microns. Once the line traces, bumps and other structures are fabricated the photoresist is removed in a stripping process again typically using aqueously based solutions.

Current negative working photosensitive photoresist compositions used in thick film photofabrication processes are based on poly-hydroxy-styrene-co-acrylic acid (PSA) compositions. Acrylated monomers and photosensitive free radical initiators are also present in the photoresist which crosslink when exposed to actinic radiation. When the photoresist is exposed to actinic radiation, free radicals are generated which cause the acrylate monomers to crosslink creating a polymerized network around the PSA polymer. When a sufficiently crosslinked network is created the areas exposed to actinic radiation will be insoluble in the developing solution while the unexposed areas are solubilized and removed leaving behind a pattern of relief structures on a substrate. Processes involving electroplating deposit metals such as gold, copper, nickel, tin, and solder into the structures. Removal of the exposed photoresist by stripping solutions results in the desired metal structures.

As the thickness of the negative working photosensitive photoresist increases it becomes more difficult to fully cure the photoresist such that the bottom of the photoresist, nearest the substrate, is less cured than the top of the photoresist, which can result in undercutting of the photoresist and underplating when electroplated. Attempts to improve the bottom cure include adding acrylate monomers which have 3 or more acrylate substitutions as well as increasing the quantity of free radical initiators and increasing the time to photocure the photoresist, a process that can overcure the top to the photoresist. However, PSA polymers are known to be free radical inhibitors which reduce the effectiveness of the photo-generated free radicals which reduces their ability to fully cure the photoresist.

Another limitation of free radical inhibition of negative working photosensitive photoresist is surface rounding wherein the line acuity or definition of the top of the traces or holes are dissolved away and when electroplated this results in lines which are not square or rectangular in cross-section. Also free radical inhibition will result in lines which are not completely uniform resulting in metal lines which are wavy and not straight. Metal lines, posts and bumps which are not uniform result in non-uniform electric signals.

Additionally relief structures from negative working photosensitive photoresists which are poorly cured can result in incompatibility of the photoresist with the electroplating solution as some organic materials may be extracted into the solution causing limited electroplating bath life.

When negative working photosensitive photoresists are cured it is often difficult to remove them after processing in a stripping step. Typically stripping is performed using aqueous alkaline solutions. Often not all the photoresist is removed, especially in high aspect ratio, high density applications, and that cured photoresist that is removed is often gelatinous, of solid pieces which can redeposit or clog lines and other issues.

Thus there is a need for a negative work photosensitive photoresist which is fully cured at fast speed, has non-rounded profiles, is compatible with the electroplating solution, is free of free radical quenching materials, and is easily stripped.

SUMMARY OF THE INVENTION

It has surprisingly been found that negative working photosensitive photoresists based on a new acrylate polymer composition can be used to provide thick film photoresist applications which give sharp photoresist profiles, high photospeed, high through-cure, high compatibility with electroplating solutions, high aspect ratio and are readily strippable.

In a first embodiment, disclosed and claimed herein are negative working photosensitive photoresist compositions comprising at least one polymer comprising a structure of the following formula (1):

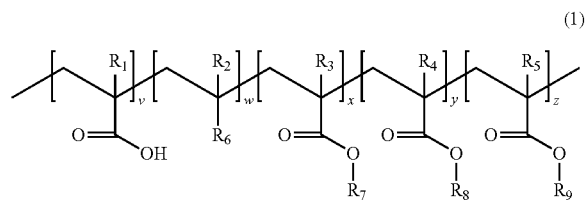

wherein $R_1$-$R_5$ is independently H, F or $CH_3$, $R_6$ is selected from a group consisting of a substituted aryl, unsubstituted aryl, substituted heteroaryl group and substituted heteroaryl group, $R_7$ is a substituted or unsubstituted benzyl group, $R_8$ is a linear or branched $C_2$-$C_{10}$ hydroxy alkyl group or a $C_2$-$C_{10}$ hydroxy alkyl acrylate and $R_9$ is an acid cleavable group, v=10-40 mole %, w=0-35 mole %, x=0-60 mole %, y=10-60 mole % and z=0-45 mole %; one or more free radical initiators activated by actinic radiation, one or more crosslinkable acrylated monomers capable of undergoing free radical crosslinking wherein the acrylate functionality is greater than 1, and a solvent.

In a second embodiment, disclosed and claimed herein are the negative working photosensitive photoresist compositions of the above embodiment wherein the composition is capable of being solubilized in aqueous alkaline developer prior to crosslinking the acrylate monomers.

In a third embodiment, disclosed and claimed herein are the negative working photosensitive photoresist compositions of the above embodiments further comprising at least one polymer comprising the reaction product of styrene and at least one acid containing monomer or maleic anhydride, said anhydride reaction product being further partially esterified with an alcohol.

In a fourth embodiment, disclosed and claimed herein are negative working photosensitive photoresist compositions of the above embodiments further comprising one or more crosslinkable acrylated siloxane or acrylated silsesquioxane based monomers capable of undergoing free radical crosslinking wherein the acrylate functionality is greater than 1.

In a fifth embodiment, disclosed and claimed herein are methods of forming negative relief images comprising forming a negative working photosensitive photoresist layer by applying a negative working photosensitive photoresist composition of the above embodiments to a substrate and drying, image-wise exposing the photosensitive layer to actinic radiation to form a latent image, and, developing the unexposed areas in a developer, wherein the image-wise exposed photosensitive layer is optionally thermally treated.

In a fifth embodiment, disclosed and claimed herein are methods of the above embodiment wherein the negative working photosensitive photoresist layer is between about 5 microns and 100 microns.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein the terms "photocure" and "photopolymerize" are used interchangeably and refer to free radical initiated curing or polymerization.

As used herein the term "dried" refers to films with less than 5% solvent remaining after the drying process.

As used herein the term "thick film" refer to films which are between 5-100 microns thick.

Disclosed, herein, are negative-working photosensitive photoresist compositions for thick film applications as well as methods of making thick film negative relief images. The compositions contain at least one polymer comprising a structure of the following general formula:

(1)

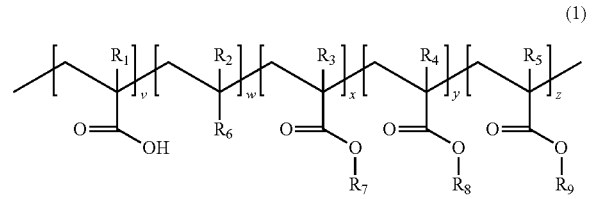

$R_1$ through $R_5$ are independently a methyl group, hydrogen or fluoride. $R_1$ through $R_5$ may be the same or different depending on the desired properties of the polymer. One of the components of the polymer contains a carboxylic acid prepared from the appropriate acrylic acid monomer, wherein $R_1$ is methyl, a hydrogen atom, or a fluoride atom. $R_6$ is a substituted or unsubstituted aryl group, such as, for example, phenyl, tolyl, xylyl, naphthyl, anthracyl, biphenyl, triphenyl and the like substituted with $C_1$-$C_{24}$ alkyl or alkenyl groups or other functional group as well as 5, 6 and 7 ring heterocyclic aromatic groups such as azoles, thiazoles, oxazoles, pyridine, pyridazine, and the like. $R_7$ is a substituted or unsubstituted benzyl group which may be substituted with, for example, $C_1$-$C_{24}$ alkyl or alkenyl groups or other functional groups. $R_8$ is a linear or branched, $C_2$-$C_{10}$ hydroxy alkyl group or a $C_2$-$C_{10}$ hydroxy alkyl acrylate such as for example, wherein the hydroxy group is attached to the second carbon in the chain such as, —$CH_2$—$CH_2$—OH, —$CH_2$—CH(OH)—$CH_3$, or —$CH_2$—CH(OH)—$CH_2$—$CH_3$ as well as wherein the hydroxy group is attached to the third carbon in the chain or other carbon. The hydroxy alkyl acrylate may be and methacrylated glycerol acrylate, —$CH_2$—CH(OH)—$CH_2$OC(O)C(=$CH_2$)$CH_3$.

The polymer may further comprise other comonomeric units, such as cyclopentadienyl acrylate and campholyl acrylate. These additional monomeric units may be present at 0-30 mole %.

$R_9$ is an acid cleavable group such as, for example, a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymenthyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo [2.2.1]heptan-2-yl group, a 2-ethyl-1,3,3-trimethylbicyclo [2.2.1]heptan-2-yl group, a 2,6,6-trimethylbicyclo[3.1.1] heptan-2-yl group, a 2,3-dimethylpentan-3-yl group, or a 3-ethyl-2-methylpentan-3-yl group or other group that is cleaved when exposed to acid leaving behind a carboxylic acid group.

V is between about 10 and about 40 mole %, w is between about 0 and about 35 mole %, x is between about 0-60 mole %, y is between about 10-60 mole % and z is between about 0-45 mole %. The general formula above is not meant to show the exact positioning of the component parts of the polymer so that the parts may exist together randomly, as well, 2 or more of the same component part may exist side-by-side in the polymer.

In accordance with the above embodiments, with reference to (I), an exemplary molar percentage range for v may be 10-30 mole %. A further exemplary molar percentage range for v may be 15-25 mole %. An exemplary molar percentage range for w may be 0-25 mole %. A further exemplary molar percentage range for w may be 0-20 mole %. An exemplary molar percentage range for x may be 0-50 mole %. A further exemplary molar percentage range for x, when present, may be 30-55 mole %. An exemplary molar percentage range for y may be 20-45 mole %. A further exemplary molar percentage range for y may be 25-40 mole %. An exemplary molar percentage range for z may be 0-35 mole %. A further exemplary molar percentage range for z, when present, may be 25-40 mole %. Mole percentages are not independent in that they must add to 100%.

The compositions may also include one or more polymers whose carboxylic acid prepared from the appropriate acrylic acid monomer, wherein $R_1$ is methyl, a hydrogen atom, or a fluoride atom, is replaced by a succinic acid half ester prepared by polymerizing maleic anhydride with other selected monomers to create a polymer and then reaction of the anhydride with an alcohol to create a carboxylic acid and an ester.

The polymers of the composition of the present composition can be prepared by any of the known methods for preparing polyacrylates. Typical methods are described below in the examples.

The herein disclosed negative-working photosensitive photoresist compositions further contain one or more free radical initiators or initiator systems activated by actinic radiation. A single photoinitiator or a photoinitiator system containing multiple components may be used. The photoinitiator can be of a specific type, such as a halogenated-2,5cyclohexadienone, benzophenone, alkylaryl ketone or diketone type, or mixtures thereof. Any of a variety of free radical generating photoinitiators can be used in the current invention. Benzophenone derivatives such as benzophenone, bis-4,4'-dimethylaminobenzophenone (Michler's ketone), bis-4,4'-diethylaminobenzophenone (ethyl Michler's ketone), benzophenones singly or multiply substituted with other alkylamino groups, chloro, methoxy, etc. are suitable. Also substituted xanthones, thioxanthones, anthrones, and fluorenones are useful initiators, as well as alkyl, chloro, and alkoxy substituted thioxanthones. Substituted cyclohexadienones can be also be used, such as with both an alkyl and a trichloromethyl substituent in the 4 position. Useful alkylarylketone derivatives include ketaldonyl alcohols such as benzoin, pivaloin, and acyloin ethers such as benzoin alkyl ethers, benzoin aryl ethers, alphahydrocarbon substituted aromatic acyloins, benzoin dialkyl ketals, benzil, benzoin esters, O-acylated oximinoketones, and alpha-amino ketones such as alpha-aminoactophenone derivatives. Substituted or unsubstituted polynuclear quinones such as 9,10-anthroquinones, 1,4-naphthquinones, and phenanthrene quinones are also possible initiators. Tertiary amines suitable as electron and or hydrogen donors can also be used as part of the initiating system such as substituted N,N-dialkylaminobenzene derivatives and ethyl-4-(dimethylamino)benzoate. Useful diketones include biacetyl, 2,3-dibenzoyl-2-norbornene, benzoylbenzal chloride, 2,2-dibromo-2(phenylsulfonyl)propanedione, alpha-naphthyl, 2,3-bornanedione, phenylpuruvic acid and 2,4-pentanedione. Representative quinones that can be used include 4-benzoquinone, 2-benzo-quinonediazide, anthraquinone, 2-methylanthraquinone, 2,6-dimethoxyanthra-quinone, 2,4,8-trichloroanthraquinone, amino anthraquinone, 1,4-napthoquinone derivatives and phenanthrenequinones. Also useful as photoinitiators are 2,4,5-triphenylimidazolyl dimers in combination with chain transfer agents, or hydrogen donors.

The herein disclosed negative-working photosensitive photoresist compositions further contain one or more crosslinkable acrylated monomers capable of undergoing free radical crosslinking, wherein the acrylate functionality is greater than 1. Suitable monomers include 1,4-butanediol diacrylate, 1,5-pentanedioldiacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, glycerol triacrylate, trimethylolpropane triacrylate, pentaerythritol triacrylate, polyoxyethylated trimethylolpropane tri(meth)acrylate, polypropoxylated trimethylolpropane tri(meth)acrylate and similar compounds, 2,2-di(p-hydroxyphenyl) propane diacrylate, pentaerythritol tetraacrylate, 2,2di(p-hydroxyphenyl)propane dimethacrylate, triethylene glycol diacrylate, polyoxyethyl-2,2-di(p-hydroxyphenyl)propane dimethacrylate, bisphenol A diacrylate, di-(3-methacryloxy-2-hydroxypropyl)ether of bisphenol A, di-2-methacryloxyethyl ether of bisphenol A, di-(3-acryloxy-2-hydroxypropyl) ether of bisphenol A, di-2acryloxyethyl ether of bisphenol A, di-(3-methacryloxy-2-5 hydroxypropyl)ether of tetrachlorobisphenol A, di-2methacryloxyethyl ether of tetrachlorobisphenol A, di-(3methacryloxy-2-hydroxypropyl)ether of tetrabromobisphenol A, di-2-methacryloxyethyl ether of tetrabromobisphenol A, di-(3-methacryloxy-2-hydroxypropyl) ether of 1,4-butanediol, triethylene glycol dimethacrylate, trimethylpropane trimethacrylate, ethylene glycol dimethacrylate, butylene glycol dimethacrylate, 1,3-propanediol dimethacrylate, 1,2,4-butanetriol trimethacrylate, 2,2,4trimethyl-1,3-pentanediol dimethacrylate, 1,2,4-butanetriol trimethacrylate, 2,2,4-trimethyl-1,3-pentanediol 1,5 dimethacrylate, pentaerythritol trimethacrylate, 1-phenylethylene-1,2-dimethacrylate, pentaerythritol tetramethacrylate, 1,5-pentanediol dimethacrylate, 1,4-benzenediol dimethacrylate, 1,3,5-triisopropenyl benzene and polycaprolactone diacrylate.

Solvents useful in the present disclosure are selected from the group consisting of $C_1$-$C_4$ alcohols, $C_4$-$C_8$ ethers, $C_3$-$C_6$ ketones, $C_3$-$C_6$ esters, and mixtures thereof. Examples of $C_1$-$C_4$ alcohols include methanol, ethanol, 1-propanol, and 2-propanol. Examples of $C_4$-$C_8$ ethers include diethyl ether, dipropyl ether, dibutyl ether and tetrahydrofuran. Examples of $C_3$-$C_6$ ketones include acetone, methyl ethyl ketone and cyclohexanone. Examples of $C_3$-$C_6$ esters include methyl acetate, ethyl acetate and n-butyl acetate.

Examples of suitable organic solvents include ketones such as acetone, methyl ethyl ketone, cyclohexanone, methyl isoamyl ketone, methyl amyl ketone, and the like, polyhydric alcohols and derivatives thereof such as monomethyl, monoethyl, monopropyl, monobutyl and monophenyl ethers of ethyleneglycol, ethyleneglycol monoacetate, diethyleneglycol, diethyleneglycol monoacetate, propyleneglycol, propyleneglycol monoacetate, dipropyleneglycol or dipropyleneglycol monoacetate and the like, cyclic ethers such as dioxane, tetrahydrofuran and the like, esters such as methyl lactate, ethyl lactate, methyl acetate, ethyl acetate, butyl acetate and the like and solvents having aromatic groups such as anisole, ethyl benzene, xylenes, chlorobenzene, toluene and the like. Examples are propyleneglycol monomethyl ether acetate, propyleneglycol monomethyl ether and ethyl lactate.

Solvents having one or more polar functional groups such as hydroxyl, ether, amide, ester, ketone, and carbonate, for example, two functional groups, which may be the same or different, such as two hydroxyl groups or one hydroxyl group and one ether group, including, for example, polyol, glycol ether, diacetone alcohol, 2-pyrrolidinone, N-methylpyrrolidinone, ethyl lactate, propylene carbonate, 1,3-dimethyl-2-imidazolidindione, and alkyl esters, and any combination thereof can be used.

For example, polyols such as polyethylene glycol, polypropylene glycol, poly(ethylene-co-propylene glycol), polyvinyl alcohol, trimethylol propane, ethylene glycol, glycerin, diethylene glycol, triethylene glycol, tripropylene glycol, tetraethylene glycol, pentaethylene glycol, 1,2-propylene glycol, 1,3-propanediol, butylene glycol, triethylene glycol, 1,2,6-hexanetriol, thiodiglycol, hexylene glycol, bis-2-hydroxyethyl ether, 1,4-butanediol, 1,2-butenediol, 1,4-butenediol, 1,3-butenediol, 1,5-pentanediol, 2,4-pentanediol, 2,4-heptanediol, 1,8-octanediol, 1,10-decanediol, 1,12-dodecanediol, 1,4-cyclohexanediol, 1,4-cyclohexanedimethanol, 1,2-bis(hydroxymethyl)cyclohexane, 1,2-bis(hydroxyethyl)-cyclohexane, 3-methyl-1,5-pentanediol, 2,2,4-trimethyl-1,3-pentanediol, neopentyl glycol, pentaerythritol, sorbitol, mannitol, and any combination thereof, including polyethylene glycol, trimethylol propane, ethylene glycol, glycerin, diethylene glycol, tripropylene glycol, and any combination thereof, can be used.

For example, glycol ethers such as ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, propylene glycol n-propyl ether, propylene glycol t-butyl ether, propylene glycol n-butyl ether, dipropylene glycol methyl ether, dipropylene glycol n-propyl ether, dipropylene glycol t-butyl ether, dipropylene glycol n-butyl ether, tripropylene glycol n-propyl ether, tripropylene glycol t-butyl ether, tripropylene glycol n-butyl ether, ethyl cellosolve, methyl cellosolve, polyethylene glycol monomethyl ether, polypropylene glycol monomethyl ether, methoxytriglycol, ethoxytriglycol, butoxytriglycol, 1-butoxyethoxy-2-propanol, and any combination thereof, including ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, and any combination thereof, can be used.

These organic solvents can be used either singly or in admixture according to need.

The desired polymer of the current disclosure, as well as the composition made therefrom, are capable of being solubilized in a suitable developer, prior to being photocured. Typical developers include aqueous alkaline developers including hydroxides, for example tetra ($C_1$-$C_4$ alkyl)ammonium hydroxide, choline hydroxide, lithium hydroxide, sodium hydroxide, or potassium hydroxide, carbonates, bicarbonates, amines and other basic materials. In some cases and some applications solvent developers well known in the industry may be used.

The currently disclosed composition may further contain polymers useful for their particular properties. For example, polymers with high acid values can be added to aid in the development stage as well as the stripping stage, such as, styrene-co-maleic anhydride-half ester, wherein the ester group may impart certain properties to the composition.

Silicon-based materials, capable of reacting with photo-generated free radicals may also be used. These materials include, for example, silsesquioxane full or partial cage materials, as well as ladder materials, which can be included to impart improved toughness, thermal stability and other desirable properties to the composition and the final relief image. Acrylates, methacrylates, and vinyl groups may be attached to the silicon material to impart curability. An example is octa-acrylo-silsesquioxane type of materials.

The current application further discloses methods of forming negative relief images. The compositions of the current disclosure are coated onto a chosen substrate and dried. The thus created film is then imagewise exposed through a negative mask using actinic radiation which output contains wavelengths suitable to generate free radicals. The patterns that are exposed to the radiation cure or harden. Developer is next applied to the film, and the areas which were not exposed to radiation are solubilized and removed from the substrate.

Coating can be accomplished by any of a number of coating methods, such as, for example, spin coating, slot coating, dip coating, curtain coating, roller coating, wire coating or other known methods. The thus applied coatings are dried of their solvent, to less than 5% solvent. Drying may be performed by hot plate heating, convection, infrared or other known methods for removing solvent from a coated film. In many thick film applications, imagewise exposure energies of less than 1000 mW at wavelengths greater than 300 nm are needed, such as 365 nm, 405 nm, 436 nm and broadband. After exposure, an appropriate developer is applied to the film, such as 0.25N tetrabutylammonium hydroxide. The developer may be applied by spin coating, dipping, spraying or soaking, and may be about room temperature or may be heated depending on the solubility of the unexposed, as well as the exposed, photoresist in the developer. Typical applications for thick film photoresists require 3/1 aspect ratio, wherein the photoresist at 30-60 microns thicknesses create holes and trenches which are 15-70 microns wide.

After removing the unexposed areas, patterns has been created in the film with the surface of the substrate now capable of further processing, such as, for example, electroplating metal into the relief areas, creating metal lines, bumps, trenches and other structures. The surface which has now been exposed may be subjected to etching of materials on the substrate. After etching, electroplating or other processing, the negative photoresist is removed or stripped, expect in those cases where the negative photoresist is designed to be a permanent material such as a permanent dielectric. Both electroplating and etching processes are well known in the art. Stripping solutions are generally strongly alkaline solutions and are generally heated above 100° F. Often the photoresist is cured to well that the photoresist does not dissolve on the stripping solution, but swells and is removed as a gel.

Currently available materials used in thick film application, typically containing poly-p-hydroxystyrene, suffer from undercut where the photoresist lifts from the substrates surface during either development or further processing. This can be due to less than ideal adhesion of the photoresist to the substrate but also may be due to poor "through cure" in which the amount of cure at the photoresist-substrate interface is incapable of fully curing the photoresist. Also currently available materials also suffer from wavy sidewalls as well as rounded tops. Both of these conditions result in electroplated bumps or traces and lines are wavy which interferes with signal propagation. The rounded tops of the photoresist structures allow metal to be "over-plated" during the electroplating process creating lines and bumps that are wider at the top than at the bottom, again interfering with signal propagation.

It has surprisingly been found that the compositions and methods of the current disclosure can be coated, dried, imagewise exposed to create thick film relief images which have smooth sidewalls, squared-off tops and no undercut or lifting. Not to be held to theory, it is believed that thee poly-p-hydroxystyrene materials act as a free radical inhibitor such that free radicals that are needed to cause crosslinking of the monomer are reduced causing incomplete curing.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Polymer Example 1

Structure

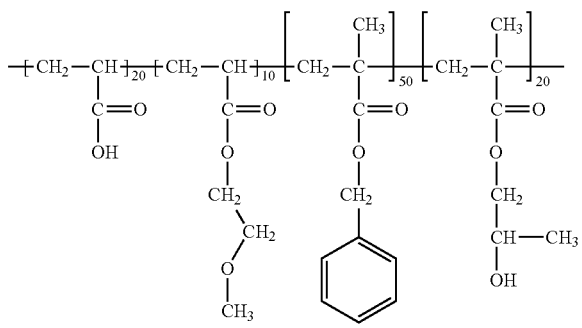

7.21 g of acrylic acid, 6.51 g of methoxyethyl acrylate, 44.05 g of benzyl methacrylate, 14.42 g of hydroxypropyl methacrylate were mixed in 295.3 g of propyleneglycol monomethylether (PGME) solvent. The polymerization reaction proceeded in the presence of 1.64 g of AIBN at 80° C., under nitrogen for 18 hours. After cooling down to room temperature, the reaction mixture was precipitated in deionized water (DI) water. The white polymer solid was washed and dried under vacuum at 50° C., yielding 66.68 g (90.3% yield) with a weight average molecular weight of 19109.

Polymer Example 2

Structure

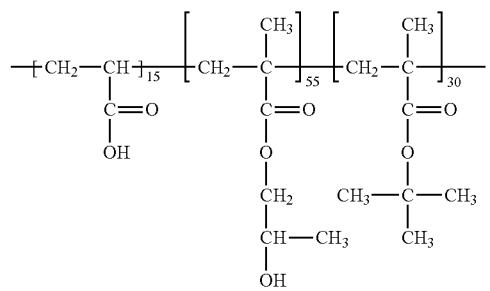

5.40 g of acrylic acid, 39.65 g of hydroxypropyl methacrylate, 21.33 g of tert-butyl methacrylate were mixed in 126.3 g of PGME solvent. The polymerization reaction proceeded in the presence of 1.64 g of AIBN at 90° C., under nitrogen for 18 hours. After cooling down to room temperature, the reaction mixture was precipitated in DI water. The white polymer solid was washed and dried under vacuum at 50° C., yielding 64.58 g (97% yield) with a weight average molecular weight of 18,734.

Polymer Example 3

Structure

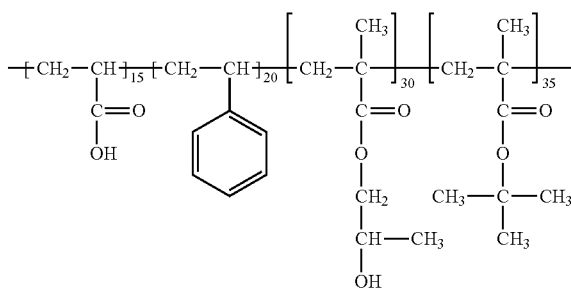

5.40 g of acrylic acid, 10.42 g of styrene, 21.62 g of hydroxypropyl methacrylate, 24.89 g of tert-butyl methacrylate were mixed in 118.7 g of PGME solvent. The polymerization reaction proceeded in the presence of 1.64 g of AIBN at 90° C., under nitrogen for 18 hours. After cooling down to room temperature, the reaction mixture was precipitated in DI water. The white polymer solid was washed and dried under vacuum at 50° C., yielding 63.0 g (99% yield) with a weight average molecular weight of 14,503.

Polymer Example 4

Structure

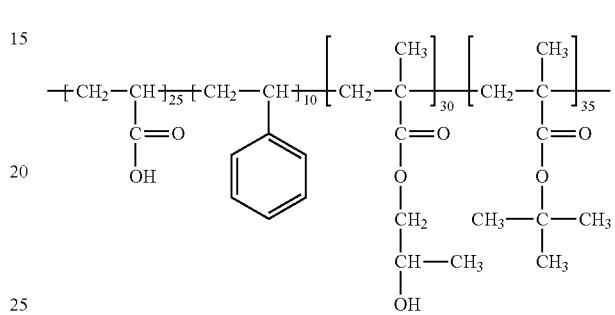

9.01 g of acrylic acid, 5.28 g of styrene, 21.62 g of hydroxypropyl methacrylate, 24.89 g of tert-butyl methacrylate were mixed in 115.8 g of PGME solvent. The polymerization reaction proceeded in the presence of 1.64 g of AIBN at 80° C., under nitrogen for 18 hours. After cooling down to room temperature, the reaction mixture was precipitated in DI water. The white polymer solid was washed and dried under vacuum at 50° C., yielding 59.67 g (98% yield) with a weight average molecular weight of 21,457.

Polymer Example 5

Structure

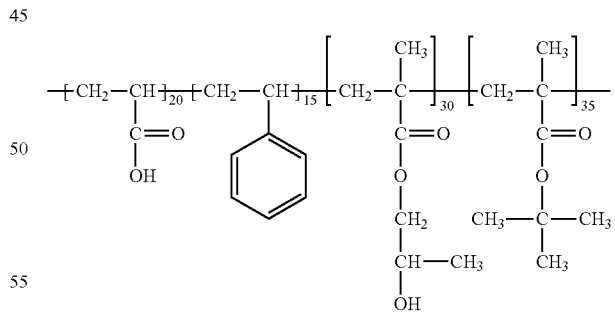

7.20 g of acrylic acid, 7.81 g of styrene, 21.62 g of hydroxypropyl methacrylate, 24.89 g of tert-butyl methacrylate were mixed in 117.3 g of PGME solvent. The polymerization reaction proceeded in the presence of 1.64 g of AIBN at 90° C., under nitrogen for 18 hours. After cooling down to room temperature, the reaction mixture was precipitated in DI water. The white polymer solid was washed and dried under vacuum at 50° C., yielding 60.80 g (99% yield) with a weight average molecular weight of 15,542.

Polymer Example 6

Structure

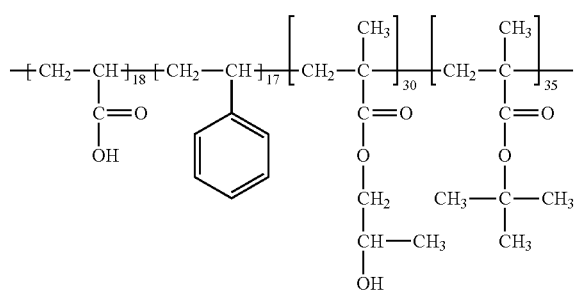

6.49 g of acrylic acid, 8.85 g of styrene, 21.62 g of hydroxypropyl methacrylate, 24.89 g of tert-butyl methacrylate were mixed in 117.9 g of PGME solvent. The polymerization reaction proceeded in the presence of 1.64 g of AIBN at 90° C., under nitrogen for 18 hours. After cooling down to room temperature, the reaction mixture was precipitated in DI water. The white polymer solid was washed and dried under vacuum at 50° C., yielding 61.0 g (98% yield) with a weight average molecular weight of 15,496.

Polymer Example 7

Structure

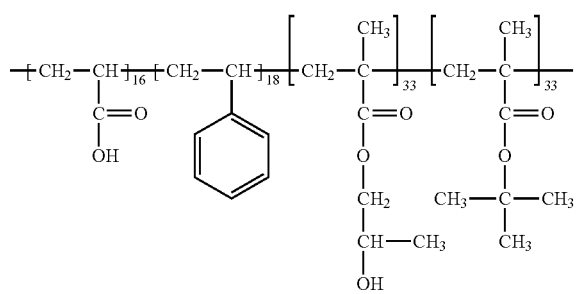

5.76 g of acrylic acid, 9.37 g of styrene, 23.79 g of hydroxypropyl methacrylate, 23.46 g of tert-butyl methacrylate were mixed in 118.9 g of PGME solvent. The polymerization reaction proceeded in the presence of 1.64 g of AIBN at 90° C., under nitrogen for 18 hours. After cooling down to room temperature, the reaction mixture was precipitated in DI water. The white polymer solid was washed and dried under vacuum at 50° C., yielding 61.5 g (99% yield) with a weight average molecular weight of 15,882.

Polymer Example 8

Structure

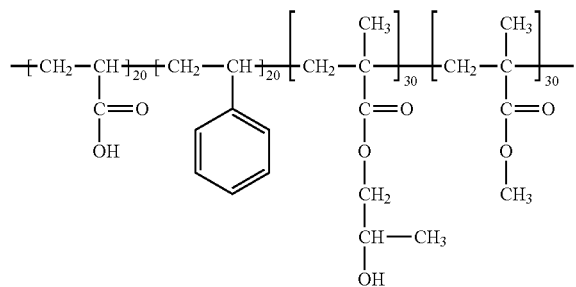

14.41 g of acrylic acid, 20.83 g of styrene, 43.25 g of hydroxypropyl methacrylate, 30.04 g of methyl methacrylate were mixed in 124.7 g of PGME solvent. The polymerization reaction proceeded in the presence of 3.28 g of AIBN at 90° C., under nitrogen for 18 hours. After cooling down to room temperature, the reaction mixture was precipitated in DI water. The white polymer solid was washed and dried under vacuum at 50° C., yielding 105.9 g (98% yield) with a weight average molecular weight of 14,327.

Polymer Example 9

Structure

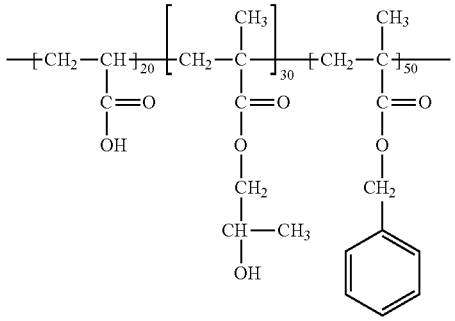

7.21 g of acrylic acid, 21.62 g of hydroxypropyl methacrylate, 44.05 g of benzyl methacrylate were mixed in 138.4 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 50° C., yielding 71.4 g (98% yield) with a weight average molecular weight of 15,929.

Polymer Example 10

Structure

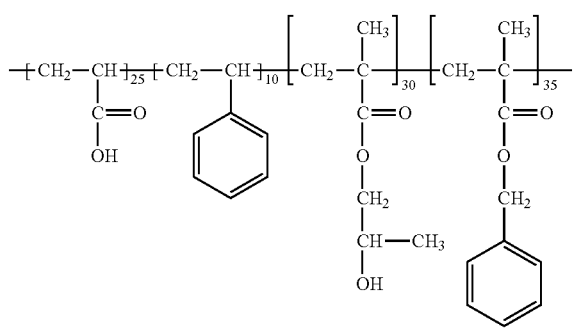

9.01 g of acrylic acid, 5.21 g of styrene, 21.62 g of hydroxypropyl methacrylate, 30.84 g of benzyl methacrylate were mixed in 126.9 g of PGME solvent. The polymerization reaction proceeded in the presence of 1.64 g of AIBN at 90° C., under nitrogen for 18 hours. After cooling down to room temperature, the reaction mixture was precipitated in DI water. The white polymer solid was washed and dried under vacuum at 50° C., yielding 64.9 g (97% yield) with a weight average molecular weight of 15,314.

COMPOSITION EXAMPLES

Except for the polymer examples, above, the copolymers/tetrapolymers and the identities of components used to produce various formulations described herein are disclosed in Table 1. Two acrylic tetrapolymers with methacrylates in the side chain (Binder-1 and Binder-2, from Miwon Commercial Co., Ltd) were used to substitute polymer examples above to increase the crosslink density in the exposed photophotoresist. Joncryl 817, 819, and 821 polymers (polyacrylate polymers from S. C. Johnson, Inc) and polyGK (a copolymer of hydroxystyrene/t-butyl methacrylate=65/35 from DuPont) resin were used to adjust the development speed. One or more of the difunctional, trifunctional, tetrafunctional and pentafunctional methacrylates and acrylates were used to adjust the crosslinking density. One or more of the photoinitiators and inhibitors were used to adjust the photospeed.

TABLE 1

| Component | Name | Manufacturer |
|---|---|---|
| Joncryl 817 | acrylic acid-styrene copolymer (MW = 14000) | Johnson Polymer |
| Joncryl 819 | acrylic acid-styrene copolymer (MW = 15000) | Johnson Polymer |
| Joncryl 821 | acrylic acid-styrene copolymer (MW = 10500) | Johnson Polymer |
| PolyGK | hydroxystyrene/t-butyl methacrylate (65/35) copolymer (MW = 11500) | DuPont |
| Binder-1 | Tetrapolymer prepared from 30% acrylic acid, 45% benzyl acrylate, 10% cyclopentadienyl acrylate and 15% methacrylated glycerol acrylate. (MW = 12,000-16,000) | Miwon Commercial Co., Ltd |
| Binder-2 | Tetrapolymer prepared from 30% acrylic acid, 25% styrene, 15% campholyl acrylate and 30% methacrylated glycerol acrylate (MW = 17,000-23,000) | Miwon Commercial Co., Ltd |
| DHDMA | 2,5-dimethyl-2,5-hexanediol dimethacrylate | AZ Electronic Materials |
| SR-268 | Tetraethylene glycol diacrylate | Sartomer |
| SR-9003B | Propoxylated (2) neopentyl glycol diacrylate | Sartomer |
| SR-454 | Ethoxylated(3) trimethylolpropane triacrylate | Sartomer |
| SR-492 | Propoxylated(3) trimethylolpropane triacrylate | Sartomer |
| SR-9020 | Propoxylated(3) glyceryl triacrylate | Sartomer |
| SR-499 | Ethoxylated(6) trimethylolpropane triacrylate | Sartomer |
| CD-501 | Propoxylated(6) trimethylolpropane triacrylate | Sartomer |
| SR-295 | Pentaerythritol tetraacrylate | Sartomer |
| SR-399 | Dipentaerythritol pentaacrylate | Sartomer |
| Irgacure 907 | 2-Methyl-1[4-(methylthio)phenyl]-2-morpholinopropan-1-one | BASF |
| Irgacure 819 | Bis(2,4,6-trimethylbenzoyl)-phenylphosphineoxide | BASF |
| CG1242 | Ethanone, 1-[9-ethyl-6-(2-mehylbenoyl)-9H-carbazol-3-yl]-, 1-(O-acetyloxime) | BASF |
| ITX | Isopropylthioxanthone | Aldrich |
| Lignostab 1198 | Hindered amine nitroxide | BASF |
| Megaface R08 | Fluorosilicon modified nonionic surfactant (90% active in PGME) | Dainippon Ink Company |
| PGME | Propylene glycol methyl ether | Dow Chemical |
| PGMEA | Propylene glycol methyl ether acetate | Dow Chemical |

Composition Example 1

36.06 g of the polymer prepared from Polymer Example 6, above, was admixed with 22.10 g of propylene glycol monomethyl ether acetate, 14.43 g of SR268, and 21.64 g of DHDMA. After rolling overnight, 3.61 g of Irgacure® 907 and 1.80 g of Irgacure® 819 were admixed. 0.01 g of Megafac® R08 and 0.26 g Lignostab® 1198 inhibitor were admixed and the admix was rolled for 2 days. The composition was filtered and spin coated on a silicon wafer and dried on a hot plate for 5 min at 140° C. The dried coating was measured to be 40 microns thick. The photoresist coating was exposed at 600 mJ/cm². The exposed coating was developed on a spin coater using 0.26 N tetramethylammonium hydroxide. The resulting negative relief had smooth sidewalls, squared off tops, and no evidence of undercut.

Composition Example 2

Composition Example 1 was repeated using the polymer from Polymer Example 5 above. The process was repeated as in Composition Example 1 with similar results except development was faster.

Composition Examples 3 and 4

Composition Example 1 was repeated using the polymer from Polymer Example 3 and Polymer Example 4 above, respectively. The process of Composition Example 1 was repeated and created coatings which developed. The composition containing Polymer Example 3 had a longer develop time to form a pattern than Polymer Example 4.

Composition Example 5

33.90 g of the polymer prepared from Polymer Example 5, above, was admixed with 29.25 g of propylene glycol monomethyl ether acetate, 6.78 g of SR268, 20.34 g of DHDMA and 6.78 g of SR-454. After rolling overnight, 1.70 g of Irgacure® 907 and 0.85 g of Irgacure® 819 were admixed. 0.24 g of Megafac R08 and 0.17 g Lignostab 1198 inhibitor were admixed and the admix was rolled for 2 days. The composition was filtered and spin coated on a silicon wafer and dried on a hot plate for 6 min at 140° C. The dried coating was measured to be 50 microns thick. The photoresist coating was exposed at 600 mJ/cm². The exposed coating was developed on a spin coater using 0.26 N tetramethylammonium hydroxide. The resulting negative relief had smooth sidewalls, squared off tops, and no evidence of undercut.

Composition Examples 6, 7, 8, 9, 10 and 11

Composition Example 5 was repeated using the other trifunctional, tetrafunctional and pentafunctional methacrylates and acrylates: SR-492, SR-9020, SR-499, CD-501, SR-295 and SR-399, respectively. The process of Composition Example 5 was repeated and created coatings which developed slowly or quickly. The resulting negative relief had smooth sidewalls, squared off tops, and no evidence of undercut.

In some of the examples above, an acrylate polymer with acid values above 50 and polyGK were added to adjust for development speed, including, for example, Joncryl 821 (with an Acid Value of about 70).

Composition Example 12

33.81 g of the polymer prepared from Polymer Example 5, above, was admixed with 29.17 g of propylene glycol monomethyl ether acetate, 13.5 g of SR268 and 20.28 g of DHDMA. After rolling overnight, 1.69 g of Irgacure® 907, 0.85 g of Irgacure® 819 and 0.34 g of ITX were admixed. 0.24 g of Megafac R08 and 0.10 g Lignostab 1198 inhibitor were admixed and the admix was rolled for 2 days. The composition was filtered and spin coated on a silicon wafer and dried on a hot plate for 6 min at 140° C. The dried coating was measured to be 50 microns thick. The photoresist coating was exposed at 1000 mJ/cm². The exposed coating was developed on a spin coater using 0.26 N tetramethylammonium hydroxide. The resulting negative relief had smooth sidewalls, squared off tops, and residues in contact holes.

Composition Example 13

32.37 g of the polymer prepared from Polymer Example 5, above, was admixed with 32.37 g of propylene glycol monomethyl ether acetate, 3.24 g of SR268, 19.42 g of DHDMA and 9.71 g of SR-399. After rolling overnight, 1.62 g of Irgacure® 907, 0.81 g of Irgacure® 819 and 0.17 g of CGI 242 were admixed. 0.23 g of Megafac R08 and 0.08 g Lignostab 1198 inhibitor were admixed and the admix was rolled for 2 days. The composition was filtered and spin coated on a silicon wafer and dried on a hot plate for 6 min at 140° C. The dried coating was measured to be 50 microns thick. The photoresist coating was exposed at 400 mJ/cm². The exposed coating was developed on a spin coater using 0.26 N tetramethylammonium hydroxide. The resulting negative relief had smooth sidewalls, squared off tops, and no evidence of undercuts.

Composition Example 14

31.57 g of Binder-1 polymer was admixed with 33.81 g of propylene glycol monomethyl ether acetate, 19.94 g of DHDMA and 7.89 g of SR-399. After rolling overnight, 1.58 g of Irgacure® 907, 1.10 g of Irgacure® 819 and 0.05 g of CGI 242 were admixed. 0.22 g of Megafac R08 and 0.09 g Lignostab 1198 inhibitor were admixed and the admix was rolled for 2 days. The composition was filtered and spin coated on a silicon wafer and dried on a hot plate for 6 min at 140° C. The dried coating was measured to be 50 microns thick. The photoresist coating was exposed at 200 mJ/cm². The exposed coating was developed on a spin coater using 0.26 N tetramethylammonium hydroxide. The resulting negative relief had smooth sidewalls, no residue in contact holes, and no evidence of undercuts.

Composition Example 15

Composition Example 14 was repeated using the Binder-2 polymer in place of Binder-1 polymer. The process of Composition Example 14 was repeated and created coatings which developed slowly. The resulting negative relief had smooth sidewalls, residues in contact holes, and no evidence of undercut.

We claim:

1. Negative working photosensitive photoresist composition comprising:

a) at least one polymer comprising a structure of the following formula:

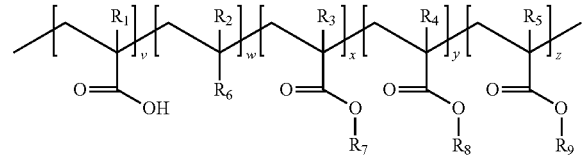

wherein $R_1$-$R_5$ is independently H, F or $CH_3$, $R_6$ is selected from a group consisting of a substituted aryl, unsubstituted aryl, substituted heteroaryl group and substituted heteroaryl group, $R_7$ is a substituted or unsubstituted benzyl group, $R_8$ is a linear or branched $C_2$-$C_{10}$ hydroxy alkyl group or a $C_2$-$C_{10}$ hydroxy alkyl acrylate and $R_9$ is an acid cleavable group, v=10-40 mole %, w=0-35 mole %, x=0-60 mole %, y=10-60 mole % and where z is present and ranges up to 45 mole %, b) one or more free radical initiators activated by actinic radiation, c) one or more crosslinkable acrylated monomers capable of undergoing free radical crosslinking wherein the acrylate functionality is greater than 1, and d) a solvent.

2. The negative working photosensitive photoresist composition of claim 1, wherein $R_9$ is an acid cleavable group chosen from a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, or a 3-ethyl-2-methylpentan-3-yl group.

3. The negative working photosensitive photoresist compositions of claim 1, wherein the composition is capable of being solubilized in aqueous alkaline developer prior to crosslinking the acrylate monomers.

4. The negative working photosensitive photoresist composition of claim 1, further comprising at least one polymer comprising the reaction product of at least one acid containing monomer and optionally styrene, or the reaction product of maleic anhydride and styrene, said anhydride reaction product being further partially esterified with an alcohol.

5. The negative working photosensitive photoresist composition of claim 1, wherein $R_6$ is phenyl and $R_8$ is 2-hydroxyethyl, 2-hydroxypropyl, 2-hydroxybutyl or 2-hydroxypentyl.

6. The negative working photosensitive photoresist composition of claim 1, further comprising one or more crosslinkable acrylated siloxane or acrylated silsesquioxane based monomers capable of undergoing free radical crosslinking wherein the acrylate functionality is greater than 1.

7. The negative working photosensitive photoresist composition of claim 6, wherein $R_9$ is an acid cleavable group chosen from a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, or a 3-ethyl-2-methylpentan-3-yl group.

8. The negative working photosensitive photoresist composition of claim 6, wherein the composition is capable of being solubilized in aqueous alkaline developer prior to crosslinking the acrylate monomers.

9. The negative working photosensitive photoresist composition of claim 6, further comprising at least one polymer comprising the reaction product of at least one acid containing monomer and optionally styrene, or the reaction product of maleic anhydride and styrene, said anhydride reaction product being further partially esterified with an alcohol.

10. A method of forming a negative relief image comprising:
   a) forming a negative working photosensitive layer by applying a negative working photosensitive photoresist composition of claim 1 to a substrate and drying,
   b) image-wise exposing the photosensitive layer to actinic radiation to form a latent image, and,
   c) developing the unexposed areas in a developer,
   wherein the image-wise exposed photosensitive layer is optionally thermally treated.

11. The method of claim 10, wherein the negative working photosensitive photoresist layer has a dried film thickness of between about 5 microns and about 100 microns.

12. The method of claim 10, wherein the actinic radiation has wavelengths greater than 300 nm.

* * * * *